(12) United States Patent
Chen et al.

(10) Patent No.: US 7,598,815 B2
(45) Date of Patent: Oct. 6, 2009

(54) MULTIPLE FREQUENCY GENERATOR FOR QUADRATURE AMPLITUDE MODULATED COMMUNICATIONS

(75) Inventors: Jinghong Chen, Basking Ridge, NJ (US); Chunbing Guo, Parsippany, NJ (US); Fuji Yang, Holmdel, NJ (US)

(73) Assignee: Agere Systems Inc., Allentown, PA (US)

( * ) Notice: Subject to any disclaimer, the term of this patent is extended or adjusted under 35 U.S.C. 154(b) by 110 days.

(21) Appl. No.: 11/866,766

(22) Filed: Oct. 3, 2007

(65) Prior Publication Data

US 2008/0100387 A1    May 1, 2008

Related U.S. Application Data

(60) Provisional application No. 60/862,870, filed on Oct. 25, 2006.

(51) Int. Cl.
   *H03B 21/01*    (2006.01)
   *H03L 7/00*    (2006.01)
   *H03L 7/18*    (2006.01)

(52) U.S. Cl. .............. 331/16; 331/8; 331/37; 331/41; 331/43; 455/260

(58) Field of Classification Search .......... 331/8, 331/16, 18, 25, 37–43; 455/260, 313, 323, 455/333
See application file for complete search history.

(56) References Cited

U.S. PATENT DOCUMENTS

| | | | | |
|---|---|---|---|---|
| 3,363,193 A | * | 1/1968 | Arnold | 331/3 |
| 3,379,992 A | * | 4/1968 | Hoo | 331/2 |
| 4,581,749 A | * | 4/1986 | Carney et al. | 375/302 |
| 5,307,029 A | * | 4/1994 | Schenk | 331/37 |
| 6,850,121 B1 | * | 2/2005 | Detering et al. | 331/37 |
| 6,960,962 B2 | * | 11/2005 | Peterzell et al. | 331/40 |
| 7,323,945 B2 | * | 1/2008 | Cyr et al. | 331/16 |
| 2007/0026816 A1 | * | 2/2007 | Heidari et al. | 455/76 |

OTHER PUBLICATIONS

"A 40 Gb/s SMC Optical Communication System based on an Integrated CMOS Transceiver," ECOC-IOOC 2003 Proceedings, vol. 4, pp. 918-919.

\* cited by examiner

*Primary Examiner*—David Mis

(57) ABSTRACT

Multiple carrier frequencies are provided from a phase locked loop, especially closely adjacent quadrature amplitude modulated subcarriers for multiplexed data communications. A quadrature voltage controlled oscillator (VCO) and cascaded frequency dividers provide feedback to a phase comparator to lock the VCO to a reference signal. In addition to frequency divider outputs for use as subcarriers, e.g., binary division factors of the VCO frequency, a quadrature mixer multiplies and adds corresponding quadrature components at two of the frequencies, to generate a differential signal at a difference frequency. The mixer may be outside of the feedback signal path but preferably is in the feedback path to suppress noise. A polyphase filter converts the mixer output to a quadrature signal useful as a subcarrier. The technique efficiently generates sequential integer multiples of a basic frequency, such as sixteen adjacent integer multiples of a frequency reference.

19 Claims, 3 Drawing Sheets

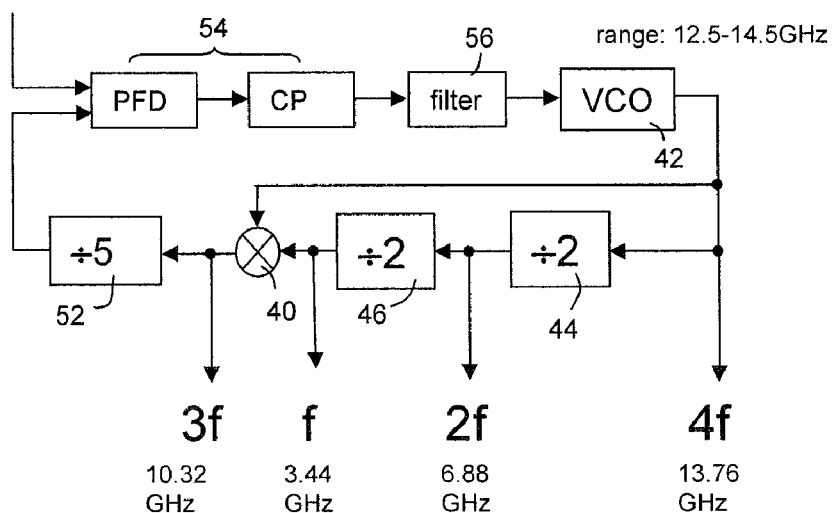
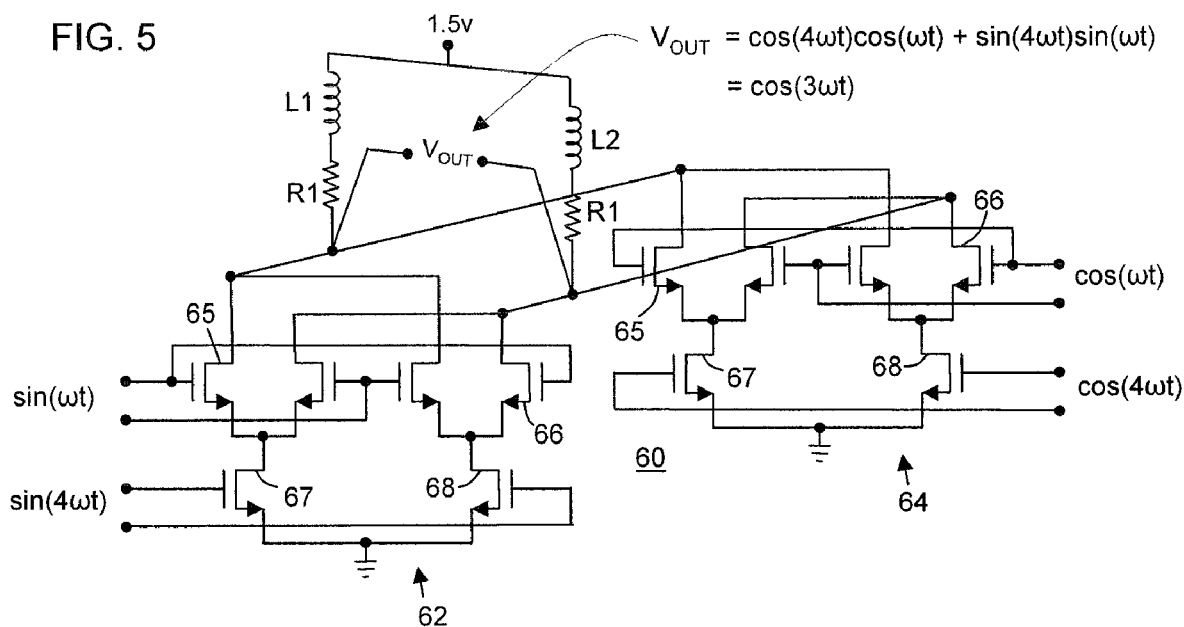

| | | | | |
|---|---|---|---|---|
| → ω1 | --- | --- | --- | ω1 = 16f |
| ω2 | ÷2 | --- | --- | ω2 |
| | | ω4: ω1 | --- | ω3 |
| ω4 | ÷2 | --- | --- | ω4 |
| | | | ω8:ω3 | ω5 |
| | | ω8: ω2 | --- | ω6 |
| | | ω8:ω1 | --- | ω7 |
| ω8 | ÷2 | --- | --- | ω8 |
| | | | ω12:ω3 | ω9 |
| | | | ω12:ω2 | ω10 |
| | | | ω12:ω1 | ω11 |
| | | ω16:ω4 | --- | ω12 |
| | | | ω16:ω3 | ω13 |
| | | ω16:ω2 | --- | ω14 |
| | | ω16:ω1 | --- | ω15 |
| ω16 | ÷2 | --- | --- | ω16 = f | ations.

MULTIPLE FREQUENCY GENERATOR FOR QUADRATURE AMPLITUDE MODULATED COMMUNICATIONS

CROSS REFERENCE TO RELATED APPLICATION

This application claims the priority of U.S. Provisional Application Ser. No. 60/862,870, filed 25 Oct. 2006.

BACKGROUND OF THE INVENTION

1. Field of the Invention

The invention relates to the generation of multiple related carrier frequencies using a phase locked loop, and in particular generates quadrature carriers at regularly spaced integer multiples of a given frequency.

2. Prior Art

A phase locked loop typically comprises a voltage controlled oscillator (VCO) operating at a relatively higher frequency that is a multiple of a desired lower output frequency. One or more frequency dividers in a feedback signal path counts down the oscillator frequency, providing one or more lower frequency outputs. A phase comparator compares one of the available frequencies to a reference signal. The output of the phase comparator is integrated and used to adjust the frequency of the voltage controlled oscillator up or down, causing the oscillator to track changes in the frequency of the reference signal over time.

In a configuration requiring a binary relationship between the oscillator frequency and desired lower frequency outputs, the frequency divider can comprise one or more serially cascaded divide-by-two stages (i.e., flip-flops). Each stage further divides the original VCO output signal frequency by two. In configurations that require frequencies that are related by other multiples (whether in the phase locked loop signal path or external to the path), counters and/or gate circuits can produce an output that divides the high frequency signal by providing an output on some recurring basis. Two or more parallel counters and/or gate arrangements that provide true outputs at some interval are possible for use in such circuits.

The outputs of such counters and gates can provide reference inputs to multiple phase comparators that control the frequencies of separate independently controlled VCOs. Typically, one VCO is used for each required output frequency that is not a multiple of another VCO frequency. Providing multiple VCOs is complex and can be expensive. There are performance issues with power consumption. The independent VCOs are independently controlled for tracking purposes, and are prone to crosstalk. It would be advantageous to provide a different, simpler and less expensive solution.

The elements of a phase locked loop, such as the VCO and frequency dividers, can be single phase devices or can be embodied as quadrature devices, i.e., wherein two synchronous signal phases are provided at a phase difference of 90 degrees ($\pi/2$ radians). Inasmuch as the quadrature signals are synchronous, it may be sufficient to provide a single phase control signal path in a phase locked loop, or only one phase may actually be needed to compare the signal against a reference input frequency at the phase comparator to control a VCO. Nevertheless, quadrature circuits are known for the oscillators and other elements of a phase locked loop, and are efficiently and inexpensively embodied in complementary circuit elements (e.g., CMOS).

An advantageous application for a quadrature phase locked loop is the generation of multiple carrier frequencies, each for quadrature amplitude modulation in a multiplexed communication system. In this disclosure, the terms "carrier" and "subcarrier" are used interchangeably. It would be beneficial if such a system could operate by multiplexing a relatively large number of relatively closely-spaced modulated subcarriers. The subcarriers can be sequentially adjacent integer multiples of the same frequency (a lowest frequency), wherein the highest integer multiple in the sequence is a frequency that defines the spacing between the center frequencies in the sequence of frequencies. This results in a bandwidth-efficient modulation technique.

A multiplex communication system using 16 microwave carriers, each of which carries a 16 point quadrature amplitude modulation signal, is described, for example, in "A 40 Gb/s SMC Optical Communication System based on an Integrated CMOS Transceiver," ECOC-IOOC 2003 Proceedings, Vol. 4, pages 918-919, which is hereby incorporated in this disclosure. In the embodiment described in that article, a data bit rate was 666 Mb/s, per carrier, which bit rate can be supported by a digital signal processor that pipelines processing of incoming data bits. The carriers that are preferred are successive integer multiples of a frequency that defines the carrier spacing, in this case chosen as 833 MHz to provide inter-carrier separation as needed to minimize crosstalk and obtain a reasonably low error rate. One can calculate out that a resulting data capacity of 40 Gb/s is supported in a bandwidth span of 14 GHz, through a digital signal processor operating at 666 MHz.

What is still needed is an optimal way to generate the multiple closely spaced frequencies, such as sixteen separate quadrature phase carriers that are multiples of a predetermined basic frequency (e.g., one to sixteen times 833 MHz, respectively), in a manner that is robust and dependable, inexpensive, yet characterized by a precision and accuracy that enables the carrier frequencies to be modulated, transmitted, received, demodulated and decoded without undue noise.

SUMMARY OF THE INVENTION

It is an aspect of the present invention that plural closely spaced carrier frequencies are produced using a same phase locked loop as opposed to plural synchronized phase locked loops.

According to one aspect, a phase locked loop for generating multiple carriers from the outputs of a quadrature VCO, operating at a given highest carrier frequency, is passed through serially cascaded frequency dividers. In one embodiment the dividers are binary elements, thereby generating carrier signals at f, 2f and 4f (etc.) at the respective inputs and outputs of the cascaded stages.

A further carrier signal is generated that is not an integer division of the VCO frequency or an integer division of a frequency divider output frequency. This permits a circuit operating on binary frequency divisions of a highest frequency down to a lowest basic frequency, (for example binary divisions of the VCO frequency), also to produce subcarriers that are multiples of the basic frequency but cannot be obtained by integer division of the VCO frequency. In the case of binary frequency divisions proceeding by a factor of two from 4f to 2f to f, the further carrier signal can be 3f, namely an integer multiple of the basic or lowest frequency f but related by fraction (¾) to the VCO frequency. This 3f signal is useful if the carriers are to be closely spaced as successive integer multiples of the basic frequency f, equally spaced by the highest frequency (4f in this example), but the 3f frequency cannot be obtained by frequency division alone.

(Other factors and fractions can be used beside binary frequency division and a 3f/4f fraction, which will become apparent from this disclosure.)

According to one aspect, one or more carrier frequencies are obtained using an I/Q quadrature mixing node in a manner that multiplies corresponding quadrature phase components of different frequency signals (such as f and 4f quadrature signals) and adds the results to produce a differential (single phase) signal at frequency 3f. This signal at 3f is coupled to a two stage polyphase filter that generates two quadrature phase components at frequency 3f. Using this technique, quadrature signals at each of 4f, 3f, 2f and f are obtained from the same phase locked loop.

In this disclosure, references to "coupled" signals should be construed to include either the possibility of a direct connection or the possibility of coupling through other elements that may have functional effects with respect to the signal that is thus coupled from one point to another.

According to the invention, subcarriers can be sequentially adjacent integer multiples of the same frequency (a lowest frequency), wherein the highest integer multiple in the sequence is a frequency that defines the spacing between the center frequencies in the sequence of frequencies. Furthermore, the highest frequency can be the oscillation frequency of a single VCO in a phase locked loop.

By providing one or more mixing nodes to fill in carrier frequencies between the frequencies that are supplied by binary dividers, one phase locked loop is used to produce carrier frequencies at equal intervals and at successive integer multiples of a lowest frequency. By specifically providing a phase locked loop control signal path that incorporates the output of the mixing node (such as the 3f signal in the example) to control the VCO through the phase comparator, noise that might arise from the mixing to obtain this additional frequency (e.g., 3f is suppressed by operation of the phase locked loop.

BRIEF DESCRIPTION OF THE DRAWINGS

Certain exemplary embodiments are illustrated in the drawings and discussed in the subsequent description. The invention is not limited to the embodiments disclosed as examples and is capable of other arrangements within the scope of this disclosure and claims. In the drawings.

FIG. 4 is a block diagram of a phase locked loop configuration as in FIG. 1, except wherein the non-binary integer multiple frequency (3f) is generated directly in the signal path of the phase locked loop.

FIG. 5 is a schematic diagram showing a CMOS implementation of a circuit for multiplying and adding the quadrature phases of two quadrature signal input frequencies, so as to develop a single phase signal at the difference of the input signal frequencies.

DETAILED DESCRIPTION

Figure 1:
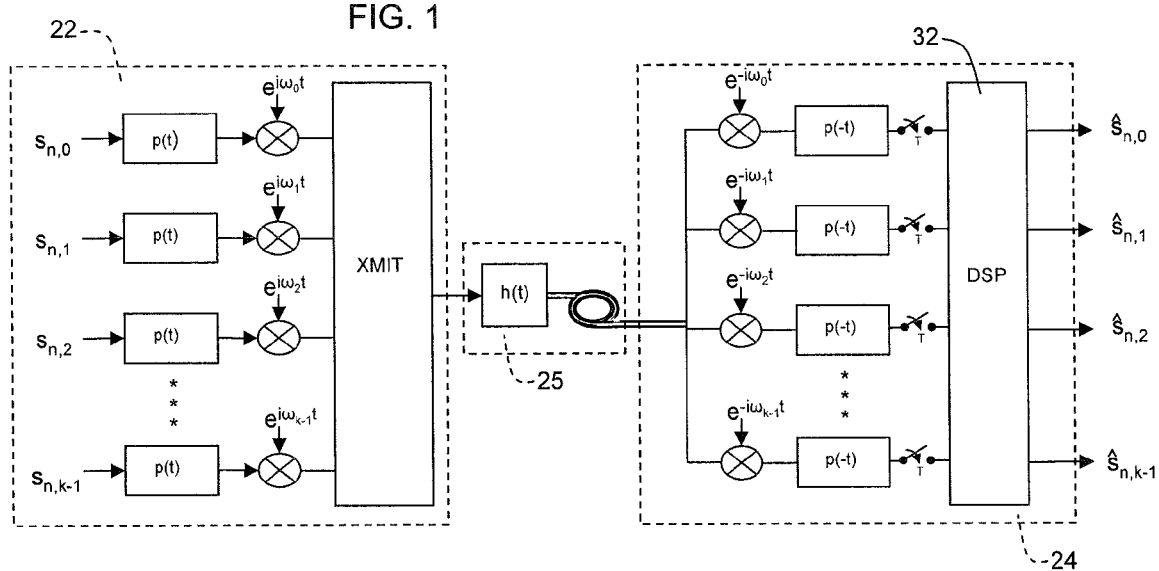
FIG. 1 is a block diagram showing the structure of a multiple subcarrier modulated optical data communications.

FIG. 1 generally shows a multi-subcarrier-modulated optical communication system. In block identified as transmitter 22, a plurality of subcarriers are modulated, each carrying a 16-point quadrature amplitude modulation (QAM) signal 'S'. A receiver 24 demodulates the data downstream of an optical fiber path 25.

The communication system uses a combination of QAM two dimensional quadrature modulation for bit value encoding, frequency divisions defined using plural modulated subcarriers, and a high bit rate per subcarrier channel. The transmitter and receiver sides are substantially complementary. On the receiver side, a digital signal processor 32 is provided for preliminary processing, error correction and the like.

The total communication bit rate is the product of the number of subcarriers, for example 16, the channel bit rate, for example 666 Mbaud, and the number of encodable variables in the two dimensional QAM-16 code. Thus the bit rate is 64 times the channel bit rate or 40 Gb/s.

Among other aspects, one aim of the invention is to provide a simple and effective subcarrier communications arrangement that is reasonably efficient as to conserving bandwidth, and can be embodied using inexpensive CMOS technology. To this end, the subcarrier frequencies are selected as adjacent integer multiples of a given frequency, and are generated using a novel subcarrier generator arrangement.

In one embodiment, 16 subcarriers are employed. The maximum RF subcarrier frequency is held to less than 14 GHz. The subcarrier frequencies are substantially evenly spaced over the available span. In one example being selected as integer multiples of 833 MHz. (Sixteen times 833 MHz is actually 13.33 GHz.) This arrangement generally holds to frequencies that are supportable at the RF front end with a highest frequency under 14 GHz, and at the back end digital signal processor with a bit rate of 666 MHz. Thus, a communications link with a full bit rate of 40 Gb/s can be fit into a 14 GHz bandwidth and implemented using inexpensive CMOS technology.

According to an aspect of the disclosure, a relatively inexpensive and noise resistant circuit is provided for generating the multiple subcarriers that are chosen, as described above, as adjacent integer multiples of a given frequency (e.g., 833 MHz). It is generally desirable to generate subcarriers that are synchronized to a common reference signal, typically using a phase locked loop. However, generating subcarriers that are adjacent integer multiples of a given frequency can be complicated.

In a phase locked loop subcarrier generator, a voltage controlled oscillator (VCO) typically is operated at some multiple of a desired output frequency and/or at some multiple of a reference frequency that the output is to track. By frequency division techniques (such as cascaded flipflops), the high frequency VCO signal is divided to a frequency that is related to the reference frequency and compared at that point to the reference signal using a phase comparator. The output of the phase comparator is applied to a low pass filter (basically an integrator) to develop the control voltage for the VCO.

In the case of 16 integer multiples of 833 MHz, a cascaded series of binary dividers would not produce all 16 integer divisions, but instead would produce binary divisions, i.e., 1-2-4-8, etc. One possible solution is to provide multiple VCOs that are controlled from the same reference, operating each VCO at a multiple of the basic frequency and using one or more counters to divide the high frequency by the respective multiple. This could potentially require 16 VCOs for 16 subcarriers, but fewer may be required if some of the prime number factors are derived by dividing a higher frequency. For example if the integer value such as 833 MHz is 'f', then 16f can be divided in a binary fashion to provide 8f, 4f, 2f and f. Likewise, 15f can be divided by three to obtain 5f and/or by five to obtain 3f, etc. Using this technique, it would nevertheless be necessary to operate multiple VCOs, with corresponding requirements as to power consumption and circuit area. Additionally, multiple independently tracking VCOs can introduce problems with crosstalk among the subcarriers.

FIGS. 3 through 6 demonstrate certain techniques wherein a multiple subcarrier generator can produce adjacent integer multiples of a given frequency but uses fewer VCOs, and in the illustrated embodiment has only one VCO. This is accomplished by using the quadrature components of two of the frequency components to produce a differential signal at a third frequency, and then passing the differential signal through a polyphase filter to produce a quadrature signal at said third frequency.

By trigonometric function, a signal derived from the combination of two input frequencies can have components at the sum and difference of the two inputs. By appropriate selection of the differential signal as the sum of the products of the two corresponding quadrature components of the two input signals, the differential signal has a frequency equal to the difference of the input frequencies.

Figure 3:
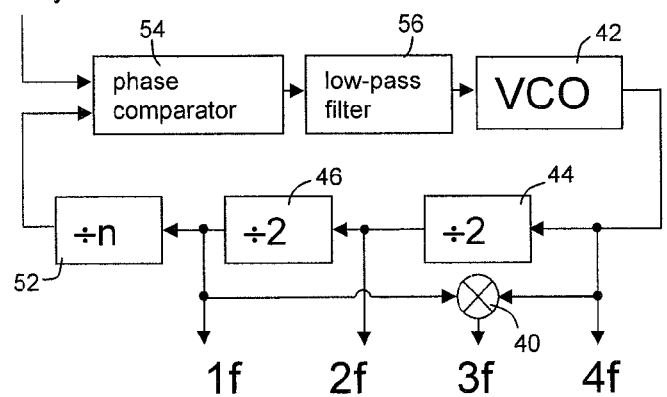
FIG. 3 is a block diagram illustrating a phase locked loop configuration for generating multiple subcarriers, wherein the subcarrier frequencies are compactly arranged as integer multiples of a particular low frequency and are produced from a higher frequency output derived from a single phase locked loop, the higher frequency output (which can be the oscillation frequency of a VCO) defining the spacing between the subcarriers.

FIGS. 3 and 4 illustrate examples of two different embodiments. In these examples, four subcarriers are shown to illustrate the subject matter. The same techniques can be extended as described below, to provide a larger number of subcarriers. Although the invention is capable of embodiment with two or more VCOs, the technique reduces the number of VCOs required, for example to as few as one VCO, and nevertheless generates multiple subcarriers at frequencies that are adjacent integer multiples, and wherein the multiples are not limited by divisions that are binary exponents but can also can include prime numbers and other factors.

In FIG. 3, a mixer node 40 is provided outside of a phase locked loop signal path to generate a mixed frequency subcarrier 3f as the difference of input frequencies 1f and 4f. FIG. 4 illustrates an embodiment wherein a similar mixer node 40 is provided in the signal path of the phase locked loop. The same reference numbers have been used where possible to identify the elements that correspond in the respective embodiments.

Referring to FIG. 3, a quadrature voltage controlled oscillator (VCO) 42 is operated at a multiple of a reference input frequency and provides an output signal at a high integer multiple of a predetermined frequency 'f'. In this example, the output of the VCO 42 directly produces the integer multiple frequency of four times the lowest integer multiple 'f' (i.e., 1f). In a generally conventional manner the phase locked loop comprises two cascaded divide-by-two frequency dividers 44, 46, which generally act as flip-flops. These dividers 44, 46 respectively divide frequency 4f to produce frequencies 2f and f. The final output frequency 1f may be equal to the reference frequency or a multiple of the reference frequency, in which event a divide-by-n counter divides frequency 1f as necessary nominally to equal the reference frequency input at the inputs to a phase comparator circuit 54. When the phase locked loop is accurately tracking the reference signal, the phase comparator produces an output that when filtered through low pass filter 56 controls the VCO to maintain the current frequency of oscillation. If the reference frequency should change or if the VCO output frequency should drift (as counted down through the respective dividers) the output of phase comparator 54 changes and through the low pass filter 56, the VCO control input voltage is altered to counteract the change and maintain a situation wherein the VCO output tracks the reference signal.

An aspect of the invention is to produce adjacent integer multiples for the respective output frequencies. It is possible to produce an integer division of frequency 4f using a frequency divider. However it is not possible to produce a frequency 3f by integer division of frequency 4f.

According to the invention, however, a quadrature mixer 40 is employed to produce from quadrature components of the 1f and 4f frequencies, a subcarrier frequency equal to the difference of the 1f and 4f frequencies, namely 3f. An exemplary embodiment of such mixer comprises a multiplier-adder circuit 60, shown in FIG. 5 and a polyphase filter circuit 70, shown in FIG. 6. These circuits are discussed in detail below.

In the embodiments shown in FIGS. 3 and 4, the VCO 42 is a quadrature oscillator and the dividers 44, 46 are each quadrature dividers. Thus each of the output frequencies 4f, 2f, 1f is a quadrature signal having available sine and cosine components 90 degrees out of phase. The mixer 40 develops a carrier 3f by mixing carrier f and carrier 4f through a quadrature mixer (an "IQ" mixer). This is accomplished in the mixer by multiplying the same quadrature components for the two frequencies f and 4f (namely wherein frequency 4f is four times frequency f and/or one quarter of the period thereof) and adding the result. The following equation states the function and FIG. 5 illustrates an exemplary circuit that accomplishes the function:

$$\cos(4\omega t)\cos(\omega t)+\sin(4\omega t)\sin(\omega t)=\cos(3\omega t)$$

The output signal $\cos(3\omega t)$ is a single phase or differential signal. In order to provide a corresponding quadrature signal, the differential signal at the difference frequency 3f is coupled through a poly-phase filter, shown in FIG. 6, to produce additional output signals including one or more differential signals that are spaced in phase by 90 degrees from the $\cos(3\omega t)$ signal and provide $\sin(3\omega t)$ components.

Figure 2:
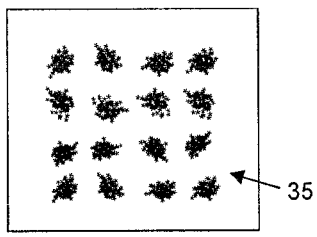
FIG. 2 is a representation of plotted bit positions produced according to FIG. 1, providing a form of input for a digital signal processor.

Referring to FIGS. 2 and 3, the difference frequency signals at 3f (i.e., $\cos(3\omega t)$ and $\sin(3\omega t)$) are derived from signals propagating in the phase locked loop feedback signal path. There is no independently controlled tracking VCO required for the difference signal. However, it is possible that the quadrature mixer 40 can be disposed in the phase locked loop feedback signal path or external to the loop.

In FIG. 2, the mixer 40 to generate carrier 3f is placed outside the phase locked loop (PLL) feedback signal path. The signals 4f, 2f, f are provided by a series of cascaded binary frequency dividers along the feedback signal path. The difference frequency carrier 3f is produced outside of the PLL by mixing two of the divided frequencies to obtain a signal at the difference of their frequencies. In FIG. 2, the loop also is shown to include a counter 52 that divides by the factor 'n' that is required to match the divided frequency of the PLL feedback signal to the particular frequency of the reference frequency input signal.

An improved architecture is shown in FIG. 4. In FIG. 4, the mixer 40 that generates carrier 3f is placed inside the PLL feedback signal path. That is, the PLL loop uses the derived signal 3f as the input to the counter 52 that divides by the factor needed to match the reference input frequency. This embodiment has the advantage that all of the carrier signals 4f, 3f, 2f, 1f that are adjacent integer multiples of frequency f, are signals generated in the PLL feedback signal path. Any in-band noise of carrier 3f can be suppressed by the PLL loop. All the carriers (f, 2f, 3f, and 4f are generally without problematic noise.

Figures 6, 7:
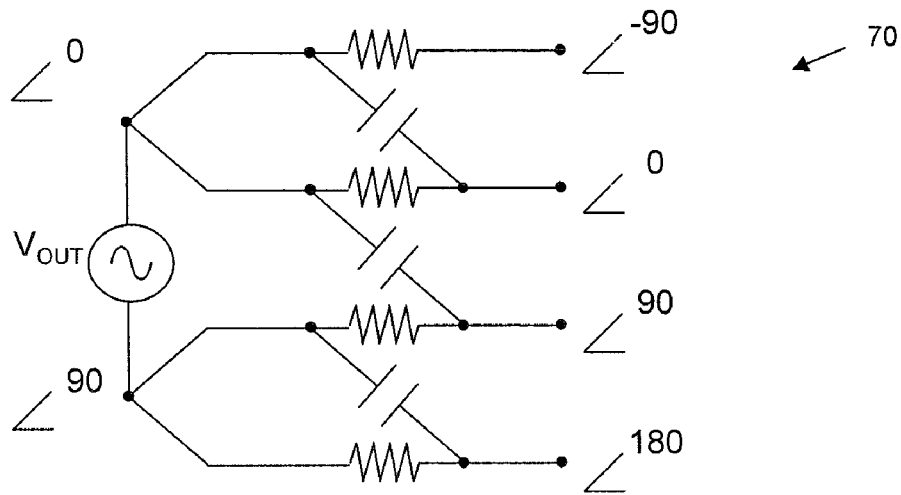
FIG. 6 is a schematic diagram illustrating a two stage polyphase filter for producing quadrature phase signals at said difference of the input signal frequencies from the single phase differential signal produced in FIG. 5.
FIG. 7 is a table illustrating extension of the technique of producing integer multiple subcarrier frequencies, including non-binary related integer multiples, to sixteen subcarriers.

Mixer 40 comprises a multiplier-adder circuit 60 that produces a single phase differential signal, shown in FIG. 5 as $V_{OUT}$, which signal is coupled through a polyphase filter 70, shown in FIG. 6, to produce the necessary quadrature carrier signal at the difference frequency (3f in the examples illustrated in FIGS. 2 and 3). The multiplier-adder 60 and polyphase filter 70 together form a quadrature mixer operable from inputs that are quadrature inputs at two different frequencies, $f_a$ and $f_b$, to produce a quadrature output signal at the difference of said two frequencies, namely $f_a-f_b$. In the embodiment shown, the frequencies are binary-related frequencies f4 and f1 such that the difference is f3. The same technique will also operate to generate other frequencies, and can be extended as shown in FIG. 7 to produce at least ten, or preferably sixteen (or more) subcarrier frequencies from the difference between frequencies originating in the PLL. Accordingly, the general statement of the mixer function is:

$$\cos(a\omega t)\cos(b\omega t)+\sin(a\omega t)\sin(b\omega t)=\cos((a-b)\omega t)$$

In this table shown as an example, several frequencies (in this case shown as wavelengths or periods ω2, ω4, ω8, ω16) are produced by binary frequency dividers. Several more wavelengths/frequencies (ω3, ω6, ω7, ω14, ω15) are generated by mixers as described, which by quadrature phase multiplication and addition produce frequencies at the difference between the frequencies taken from the binary multiples provided by the outputs of the binary dividers. Still more frequencies (ω5, ω9, ω10, ω11, ω13) are derived from the outputs of the mixers, which are identified in FIG. 7 by the input frequencies (ωa:ωb to produce ω(a−b)). This is only one example, and it is possible to provide these frequencies using the differences between other selections, or to provide frequency dividers that include non-binary division factors, or are coupled to the outputs of the mixers instead of in direct cascade with other dividers.

FIGS. 5 and 6 show exemplary circuit details that can accomplish the functions described. In FIG. 5, quadrature mixer 60 has two coupled stages 62, 64, each resonating according to the R-L time constant of a common bias circuit comprising series resistor-inductor legs R1, L1 and R2, L2. These stages 62, 64 respectively multiply the corresponding quadrature components (sine or cosine) of the two frequencies to be mixed.

Thus, the sine components of one frequency to be mixed are coupled to both transistors in two complementary pairs 65, 66 of stage 62. The corresponding sine components of the other frequency are coupled to two transistors 67, 68 that regulate the tail current from the complementary pairs 65, 66. This has the effect of multiplying the sine components of the two frequencies.

Likewise, the cosine components of one frequency to be mixed are coupled to both transistors in two complementary pairs 65, 66 of stage 64. The corresponding cosine components of the other frequency are coupled to two transistors 67, 68 that regulate the tail current from the complementary pairs 65, 66 of that stage.

The two stages 62, 64 are coupled in parallel to the biasing network of L1, R1, L2, R2. This has the effect of adding the multiplication products of the two stages 62, 64. As a result, the output signal $V_{OUT}$ carries the sum of the sine products plus the cosine products at the two frequencies. As a matter of trigonometry, the result is equal to the cosine of the difference of the two frequencies.

The difference frequency preferably is to be employed as a quadrature subcarrier frequency. Therefore, the output signal $V_{OUT}$ can be coupled to a conversion circuit as in FIG. 6, to develop a quadrature signal at the difference frequency. The signal $V_{OUT}$ is therefore coupled to a ladder circuit comprising a series/parallel array of resistors R3 through R6 and capacitors C1 through C3. These elements are coupled to provide phase delay in the charging and discharging of capacitors C1-C3 through resistors R3-R6. The desired quadrature subcarrier components (sine and cosine components of the difference frequency) can be picked off as two 90 degree phase-spaced differential signals at the outputs of the polyphase filter 70.

The invention as shown and described is subject to variations. Without limitation, some variations that should be apparent concern the number of dividers and mixers that are employed to produce different frequencies, and whether particular frequencies are from the dividers or the mixer or from a combination, possibly including mixed outputs of mixers or divisions of mixer outputs. In the embodiments shown, as few as four and up to sixteen carrier frequencies are illustrated. The technique is particularly efficient with providing closely spaced subcarriers, for example at least ten in number and more preferably sixteen. The frequencies are adjacent integer multiples of a basic frequency that defines the center frequency spacing of frequencies used in a plural subcarrier modulation system, maximizing efficiency in the use of bandwidth.

The mixer circuit 60 in the illustrated embodiment can be executed inexpensively in CMOS with minimal complexity. The system is limited in crosstalk, particularly requiring only a single VCO (although more might be used in a given embodiment). In the arrangement shown in FIG. 4, placing the mixer in cascade with the frequency dividers in the feedback signal path of the phase locked loop further limits the introduction of noise.

The invention has been described with reference various examples, but should not be considered limited to those examples. Reference should be made to the appended claims rather than the disclosure of examples, to assess the scope of the invention in which exclusive rights are claimed.

What is claimed is:

1. A circuit for generation of a carrier signal, comprising:
  a phase locked loop having a frequency-controlled oscillator responsive to a comparator, the comparator controlling the oscillator to establish a predetermined relationship of an output of the oscillator to a reference signal, wherein the phase locked loop has at least one frequency divider in a signal path coupled to the output of the oscillator such that at least two frequencies are provided at two respective points along the signal path;
  a mixer having inputs coupled to the two points along the signal path, wherein the mixer is operable to produce a differential signal at least a third frequency that has a component at a difference between the two frequencies provided at said two points; and
  a conversion circuit for producing from the differential signal a quadrature signal at the third frequency, the conversion circuit comprising a polyphase filter producing at least two differential outputs separated in phase by 90 degrees.

2. The circuit according to claim 1, wherein the frequency-controlled oscillator is a quadrature oscillator and the frequency divider is a quadrature frequency divider.

3. The circuit according to claim 2, wherein the mixer is disposed in the signal path of the phase locked loop.

4. The circuit according to claim 1, comprising a plurality of said mixers coupled to the frequencies along the signal path, wherein said mixers produce at least two frequencies that are differences between frequencies provided along the signal path.

5. The circuit according to claim 4, further comprising at least one additional mixer having an input coupled to an output at said third frequency, wherein the additional mixer produces a frequency having a component at a difference from the third frequency.

6. The circuit according to claim 2, wherein the frequency divider comprises a cascade of dividers operable to produce multiples of a basic frequency, and wherein the third frequency is a multiple of the basic frequency.

7. The circuit according to claim 6, wherein the frequency divider comprises a plurality of divide-by-two stages and the third frequency is an odd number multiple of the basic frequency.

8. The circuit according to claim 7, wherein the divide-by-two stages produce outputs at least at three binary multiples of the basic frequency and the mixer produces at least one integer multiple of the basic frequency adjacent to one of the binary multiples.

9. A carrier signal generator comprising:
a quadrature voltage controlled oscillator coupled in a phase locked loop wherein an output of the oscillator is coupled through at least one quadrature frequency divider to a phase comparator responsive to a reference signal input to control a frequency of the oscillator;
a quadrature mixer having inputs coupled to the phase locked loop on opposite sides of the quadrature frequency divider, such that two frequency inputs are applied to the quadrature mixer, the quadrature mixer including at least two stages respectively coupled to corresponding quadrature components of said two frequency inputs, and wherein outputs of the two stages are added, the quadrature mixer providing a differential output signal at a third frequency at a difference between the two frequency inputs; and
a polyphase filter coupled to the differential output signal producing two quadrature outputs at the third frequency.

10. The carrier signal generator of claim 9, wherein the quadrature frequency divider divides by a power of two and the third frequency is a non-binary division equal to said difference between the two frequency inputs.

11. The carrier signal of claim 9, comprising a plurality of frequency dividers and wherein output frequencies of at least certain of the frequency dividers and the third frequency include adjacent integer multiples of a same frequency.

12. The carrier signal generator of claim 11, wherein said same frequency is equal to a frequency of the reference signal input.

13. The carrier signal generator of claim 11, wherein outputs of the frequency dividers and output frequencies of a plurality of said quadrature mixers include a number of adjacent integer multiples of a basic frequency.

14. The carrier signal generator of claim 13, wherein the number of adjacent integer multiples is at least ten.

15. A method for generating carrier signals for multiplex communications, comprising:
providing a quadrature phase locked loop responsive to a reference frequency signal, wherein the phase locked loop comprises cascaded frequency dividers in a signal path, the frequency dividers providing signals at a plurality of integer multiples of a basic frequency;
generating at least one signal at an integer multiple of the basic frequency, by mixing at least two of said signals provided by the frequency dividers to provide a differential signal at a difference frequency of said two of said signals; and
producing, by a polyphase filter, from the differential signal a quadrature signal at the third frequency, the quadrature signal having at least two outputs separated in phase by 90 degrees.

16. The method of claim 15, wherein the frequency dividers are quadrature frequency dividers and said mixing comprises multiplying corresponding sine and cosine components of said two of said signals and adding a result of such multiplication to produce an output signal at the difference frequency.

17. The method of claim 16, wherein the output signal at the difference frequency is a differential signal, and further comprising generating from the differential signal a quadrature signal at the difference frequency.

18. The method of claim 17, wherein the signals of the frequency dividers and the quadrature signal at the difference frequency provide subcarriers that are adjacent integer multiples of the basic frequency.

19. The method of claim 16, further comprising employing the output signal at the difference frequency as a feedback signal in the signal path of the phase locked loop.

* * * * *